(12) United States Patent
Kwon (10) Patent No.: US 12,063,812 B2
(45) Date of Patent: Aug. 13, 2024

(54) DISPLAY APPARATUS

(71) Applicant: LG Display Co., Ltd., Seoul (KR)

(72) Inventor: Hak-Yeol Kwon, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 405 days.

(21) Appl. No.: 17/126,928

(22) Filed: Dec. 18, 2020

(65) Prior Publication Data

US 2021/0202881 A1    Jul. 1, 2021

(30) Foreign Application Priority Data

Dec. 31, 2019    (KR) .................. 10-2019-0179665

(51) Int. Cl.
*H10K 50/87* (2023.01)
*B60K 35/50* (2024.01)
*B60K 35/60* (2024.01)
*H05K 1/18* (2006.01)
*B60K 35/22* (2024.01)
*H10K 102/00* (2023.01)

(52) U.S. Cl.
CPC ............. *H10K 50/87* (2023.02); *B60K 35/50* (2024.01); *B60K 35/60* (2024.01); *H05K 1/189* (2013.01); *B60K 35/223* (2024.01); *H05K 2201/10128* (2013.01); *H10K 2102/311* (2023.02)

(58) Field of Classification Search
CPC .. H10K 50/87; H10K 2102/311; B60K 37/02; B60K 37/04; B60K 2370/1533; H05K 1/189; H05K 2201/10128

USPC ........................................................ 362/459
See application file for complete search history.

(56) References Cited

U.S. PATENT DOCUMENTS

| 8,218,325 | B2 | 7/2012 | Song |
| 8,405,994 | B2 | 3/2013 | Kinoe et al. |
| 2011/0141387 | A1 | 6/2011 | Ryu et al. |
| 2015/0198763 | A1 | 7/2015 | Yu |
| 2016/0227678 | A1 | 8/2016 | Park et al. |
| 2016/0291233 | A1* | 10/2016 | Trutna ................ G02B 6/0073 |

FOREIGN PATENT DOCUMENTS

| JP | 2000-193947 A | 7/2000 |
| KR | 10-2010-0067818 A | 6/2010 |
| KR | 10-2011-0112780 A | 10/2011 |
| KR | 10-1497422 B1 | 3/2015 |
| KR | 10-2016-0095696 A | 8/2016 |

\* cited by examiner

*Primary Examiner* — Andrew J Coughlin
*Assistant Examiner* — Hana S Featherly
(74) *Attorney, Agent, or Firm* — Seed IP Law Group LLP (57) ABSTRACT

A display apparatus includes a display panel, a heat dissipation plate disposed on a rear surface of the display panel, and a guide holder disposed on a rear surface of the heat dissipation plate and configured such that a printed circuit board connected to the display panel is coupled to a rear surface of the heat dissipation plate. The guide holder is formed through double injection-molding such that at least a portion of the guide holder is formed of different materials.

19 Claims, 4 Drawing Sheets

DISPLAY APPARATUS

CROSS-REFERENCE TO RELATED APPLICATION(S)

This application claims the benefit of Korean Patent Application No. 10-2019-0179665, filed on Dec. 31, 2019, which is hereby incorporated by reference in it is entirety as if fully set forth herein.

BACKGROUND

Technical Field

The present disclosure relates to a display apparatus, and more particularly to a display apparatus in which a display panel is bendable.

Description of the Related Art

Recently, with the arrival of the information age, the field of displays for visually displaying electrically conveyed information signals has rapidly developed. In response thereto, various kinds of display apparatuses have been developed.

Representative examples of such display apparatuses include a liquid crystal display (LCD) apparatus, an organic light-emitting display (OLED) apparatus, and a quantum dot display apparatus.

Some of these representative display devices may be considered a self-illuminating display device without a separate light source. However, self-illuminating display devices suffer from a number of deficiencies and disadvantages, such as requiring a separate member for coupling a printed circuit board to the rear surface of a display panel. Further, the shape of this coupling member needs to be changed to correspond to the shape or coupling structure of the display panel and it is required to optimize the coupling member for the use environment of each display apparatus, all of which limits the applications for self-illuminating display devices.

BRIEF SUMMARY

Accordingly, the present disclosure is directed to a display apparatus that substantially obviates one or more problems due to limitations and disadvantages of the related art.

One or more embodiments of a self-illuminating display apparatus, such as an organic light-emitting display apparatus, do not require a separate light source and enable the realization of a compact apparatus design and vivid color display. An organic light-emitting display apparatus includes a light-emitting element, which is provided in each subpixel. The light-emitting element includes two electrodes, which are opposite each other, and a light-emitting layer, which is disposed between the two electrodes and emits light when electrons and holes, which are transported, are recombined with each other. An organic light-emitting diode is a self-illuminating element that uses a thin light-emitting layer between electrodes, and thus has an advantage of realization of a small thickness. In addition, since an organic light-emitting diode is implemented without a separate light source, a flexible, bendable, or foldable display apparatus may be easily implemented using the organic light-emitting diode, and may further be formed in various designs.

An embodiment of the present disclosure has been provided to solve at least one of the problems described above, and an object of an embodiment of the present disclosure is to provide a printed circuit board support member that is used to couple a printed circuit board to the rear surface of a display panel and is capable of being bent to correspond to a display panel having a planar or curved shape, and a display apparatus including the same.

In addition, another object of an embodiment of the present disclosure is to provide a display apparatus in which a printed circuit board is supported by the rear surface of a thin display panel and which minimizes transfer of vibration generated from the display panel.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the invention, as embodied and broadly described herein, a display apparatus according to an embodiment of the present disclosure includes a display panel, a heat dissipation plate disposed on the rear surface of the display panel, and a guide holder disposed on the rear surface of the heat dissipation plate and configured such that a printed circuit board connected to the display panel is coupled to the rear surface thereof. The guide holder is formed through double injection-molding such that at least a portion thereof is formed of different materials.

The guide holder may include a first board-coupling portion to which a first printed circuit board is coupled, a second board-coupling portion to which a second printed circuit board is coupled, the second board-coupling portion being disposed parallel to and spaced apart from the first board-coupling portion, and a connection portion flexibly connecting the first board-coupling portion and the second board-coupling portion to each other.

The first board-coupling portion may include a first board hole formed in the first board-coupling portion such that the first printed circuit board is coupled to the first board-coupling portion, and at least one or a plurality of ribs protruding from the second surface of the heat dissipation plate of one end portion of the first board-coupling portion so as to interfere with one end portion of the display panel or the heat dissipation plate.

The first board-coupling portion or the second board-coupling portion may include a contact portion provided in at least a portion or the entire area of the surface thereof that is in contact with the heat dissipation plate.

The guide holder may be formed of a urethane material and a polycarbonate material through double injection-molding such that at least one or some of the connection portion, the ribs, and the contact portion are formed of a urethane material.

The ribs may be disposed between a plurality of flexible printed circuit boards connecting the display panel and the first printed circuit board to each other.

An adhesive pattern may be provided between the first board-coupling portion and the connection portion or between the second board-coupling portion and the connection portion to increase a contact area between different materials.

The second board-coupling portion may include a cooling groove formed in at least one side surface or in each of opposite side surfaces of the second board-coupling portion to form a cooling path between the second printed circuit board and the heat dissipation plate.

A display apparatus according to another embodiment of the present disclosure includes a display panel with a front surface to display the image, and a rear surface to the opposite side of the front surface to display the image including at least one curved region, a heat dissipation plate disposed on the rear surface of the display panel, and a guide holder including a first board-coupling portion to which a first printed circuit board connected to the display panel is coupled, a second board-coupling portion to which a second printed circuit board is coupled, the second board-coupling portion being disposed parallel to the first board-coupling portion, and a connection portion connecting the first board-coupling portion and the second board-coupling portion to each other such that the first board-coupling portion and the second board-coupling portion are flexibly curved corresponding to a curved region of the display panel. The guide holder further includes a rib protruding toward the heat dissipation plate so as to interfere with one end portion of the heat dissipation plate.

The guide holder may further include contact portions provided at portions of the first board-coupling portion and the second board-coupling portion that are in contact with the heat dissipation plate.

The guide holder may be formed through double injection-molding such that at least one or some of the connection portion, the rib, and the contact portions are formed of a polyurethane material.

It is to be understood that both the foregoing general description and the following detailed description of the disclosure are explanatory in nature and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Advantages and features of the present disclosure and methods for achieving the same will be made clear from the embodiments described below in detail with reference to the accompanying drawings. The present disclosure may, however, be embodied in many different forms, and should not be construed as being limited to the embodiments set forth herein. Rather, these embodiments are provided so that this disclosure will be thorough and complete and will fully convey the scope of the present disclosure to those skilled in the art. The present disclosure is defined only by the scope of the claims.

In the drawings for explaining the embodiments of the present invention, for example, the illustrated shape, size, ratio, angle, and number are given by way of example, and thus do not limit the disclosure of the present disclosure. Throughout the present specification, the same reference numerals designate the same constituent elements. In addition, in the following description of the present invention, a detailed description of known functions and configurations incorporated herein will be omitted when it may make the subject matter of the present disclosure rather unclear. The terms "comprises", "includes", and/or "has", used in this specification, do not preclude the presence or addition of other elements unless used along with the term "only". Singular forms are intended to include the plural forms as well, unless the context clearly indicates otherwise.

In the interpretation of constituent elements included in the various embodiments of the present invention, the constituent elements are to be interpreted as including an error range even if there is no explicit description thereof.

In the description of the various embodiments of the present invention, when describing positional relationships, for example, when the positional relationship between two parts is described using "on", "above", "below", "next to", or the like, one or more other parts may be located between the two parts, unless the term "directly" or "closely" is used.

In the description of the various embodiments of the present invention, when describing temporal relationships, for example, when the temporal relationship between two actions is described using "after", "subsequently", "next", "before", or the like, the actions may not occur in succession, unless the term "directly" or "just" is used therewith.

In the description of the various embodiments of the present invention, although terms such as, for example, "first" and "second" may be used to describe various elements, these terms are merely used to distinguish the same or similar elements from each other. Therefore, in the present specification, an element indicated by "first" may be the same as an element indicated by "second", without exceeding the technical scope of the present invention, unless otherwise mentioned.

Additionally, terms such as "first", "second", "A", "B", "(a)", "(b)", etc., may be used herein to describe the components of the embodiments. These terms are only used to distinguish one element from another element, and the essence, order, or sequence of corresponding elements is not limited by these terms. It should be noted that when it is described in the specification that one component is "connected", "coupled", or "joined" to another component, the former may be directly "connected", "coupled", or "joined" to the latter, intervening components may be present, or the former may be indirectly "connected", "coupled", or "joined" to the latter via yet another component.

In the description of the present disclosure, examples of a display apparatus may include a display apparatus in the narrow sense, such as a liquid crystal module (LCM), an organic light-emitting display (OLED) module, or a quantum dot (QD) module, which includes a display panel and a driver for driving the display panel. Further examples of the display apparatus may include a set device (or a set apparatus) or a set electronic apparatus, such as a laptop computer, a television, a computer monitor, an equipment apparatus including an automotive display or other type of vehicular apparatus, or a mobile electronic apparatus such as a smartphone or an electronic pad, which is a complete product (or a final product), including an LCM, an OLED module, or a QD module.

Therefore, in the description of the present disclosure, examples of the display apparatus may include a display apparatus itself in the narrow sense, such as an LCM, an OLED module, or a QD module, and a set apparatus, which is an application product or a final consumer apparatus including the LCM, the OLED module, or the QD module.

In some cases, an LCM, an OLED module, or a QD module, which includes a display panel and a driver, may be referred to as a "display apparatus in the narrow sense", and an electronic apparatus that is a final product including an LCM, an OLED module, or a QD module may be referred to as a "set apparatus". For example, the display apparatus in the narrow sense may include a display panel, such as an LCD, an OLED, or a QD, and a source printed circuit board (PCB), which is a controller for driving the display panel. The set apparatus may further include a set PCB, which is a set controller electrically connected to the source PCB to control the entirety of the set apparatus.

A display panel applied to the embodiment may use any type of display panel, such as a liquid crystal display panel, an organic light-emitting diode (OLED) display panel, a quantum dot (QD) display panel, or an electroluminescent display panel, but is not limited thereto, and may be applied to any type of display panel that is capable of realizing bezel bending using a flexible substrate for an OLED display panel of the embodiment and an underlying backplate support structure. Further, the shape or size of a display panel applied to a display apparatus according to the embodiment of the present disclosure is not particularly limited.

For example, when the display panel is an OLED display panel, the display panel may include a plurality of gate lines, a plurality of data lines, and a plurality of pixels respectively provided in a plurality of pixel areas defined by intersections of the gate lines and the data lines. In addition, the display panel may include an array including a thin-film transistor, which is an element for selectively applying a voltage to each of the pixels, an OLED layer on the array, and an encapsulation substrate or an encapsulation layer disposed on the array to cover the OLED layer. The encapsulation layer may protect the thin-film transistor and the OLED layer from external impacts, and may prevent moisture or oxygen from permeating the OLED layer. In addition, a layer provided on the array may include an inorganic light-emitting layer, e.g., a nano-sized material layer, a quantum dot, or the like.

Figure 1:
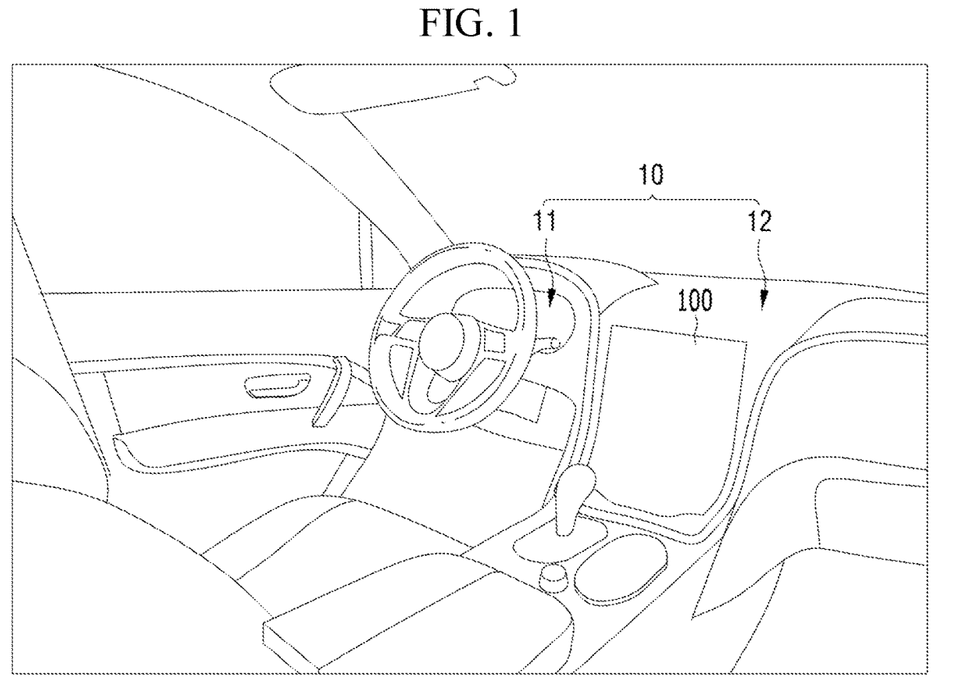
FIG. 1 is a reference view showing the interior of a vehicle in which a display apparatus according to an embodiment of the present disclosure is mounted.
Figure 2:
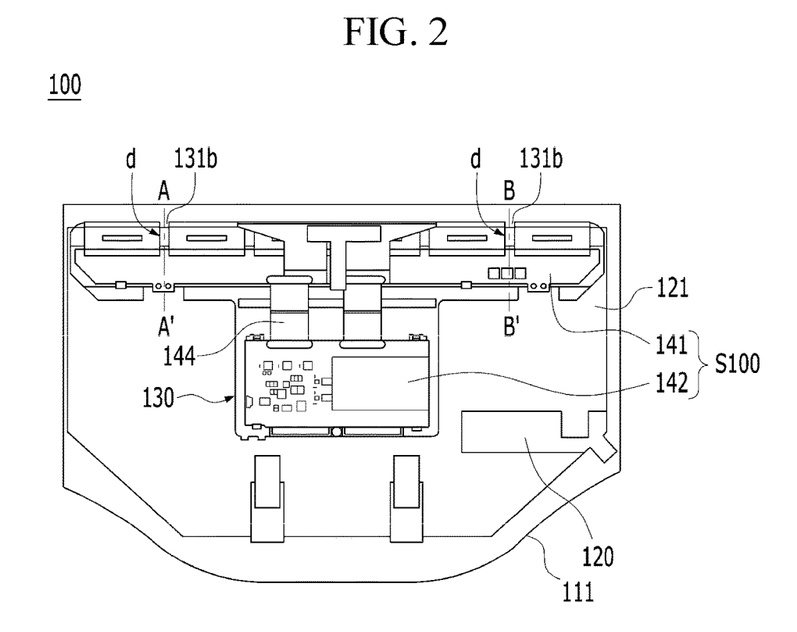
FIG. 2 is a rear view showing the rear surface of the display apparatus shown in FIG. 1.

FIG. 1 is a reference view showing the interior of a vehicle in which a display apparatus according to an embodiment of the present disclosure is mounted, and FIG. 2 is a rear view showing the rear surface of the display apparatus shown in FIG. 1.

An organic light-emitting diode (OLED) display panel is illustrated by way of example in FIG. 1.

Referring to FIGS. 1 and 2, a display apparatus 100 according to an embodiment of the present disclosure may have a substantially rectangular shape. However, the shape of the display apparatus 100 is not necessarily limited to a quadrangular shape, but the display apparatus 100 may be formed in any of various other shapes, such as a polygonal shape or a shape having a curved portion. The display apparatus 100 includes a display panel 110, a heat dissipation plate 120, and a guide holder 130.

The display apparatus 100 has a display function and a touch function that are integrated. A cover window 111 may be provided at the front side of the display apparatus 100. A display panel 110 may be disposed on the rear surface of the cover window 111. A display panel has a front surface to display the image, and a rear surface to the opposite side of the front surface to display the image. The display apparatus 100 may be disposed in an instrument panel 11 or a center fascia 12 of a dashboard 10 of a vehicle. The display panel 110 may be implemented as a substrate formed of a rigid material. However, in the case of an organic light-emitting display panel, the display panel 110 may be implemented as a flexible substrate. When implemented as a flexible substrate, the display panel 110 may be deformed concavely or convexly corresponding to the shape of the dashboard 10, and may thus be freely designed. The cover window 111 may be a cover glass formed of a glass material.

A first surface of a heat dissipation plate 120 may be disposed on the rear surface of the display panel 110. The heat dissipation plate 120 may have a shape corresponding to the shape of the display panel 110, and may be formed of a material having high thermal conductivity, such as aluminum or copper. However, the shape or material of the heat dissipation plate 120 is not limited thereto. For example, the heat dissipation plate 120 may have a shape corresponding to the position or structure of a printed circuit board coupled to the rear surface of the display panel 110 or the heat dissipation plate 120. The heat dissipation plate 120 may be formed of at least one of gold, silver, magnesium, carbon fiber, graphite, or graphene, which has high thermal conductivity.

A coating layer 121 may be provided on a second surface to the opposite side of the first surface of the heat dissipation plate 120. The coating layer 121 may be provided because the external appearance of the display apparatus may be marred by the metallic color of the heat dissipation plate 120. Further, the coating layer 121 may include a material that helps dissipate heat so as to improve the heat dissipation effect. The coating layer 121 may be formed in black or any other dark color.

Figure 3:
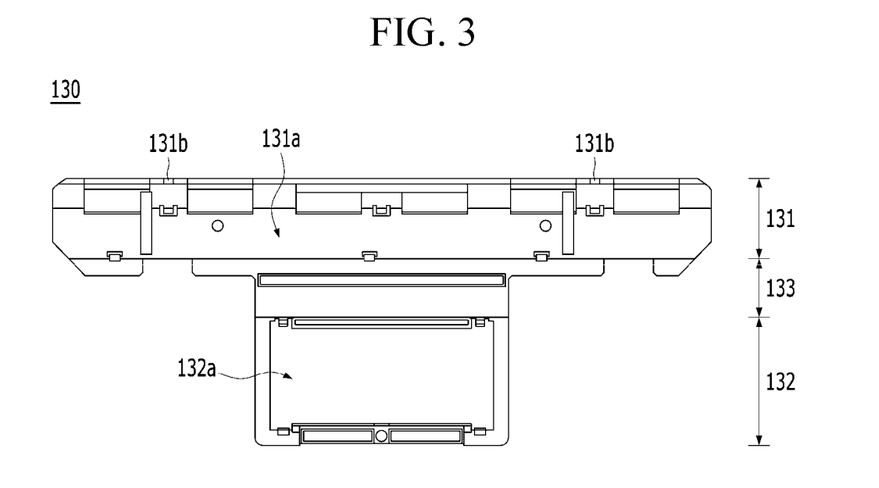
FIG. 3 is a plan view showing the guide holder shown in FIG. 2.
Figure 4:
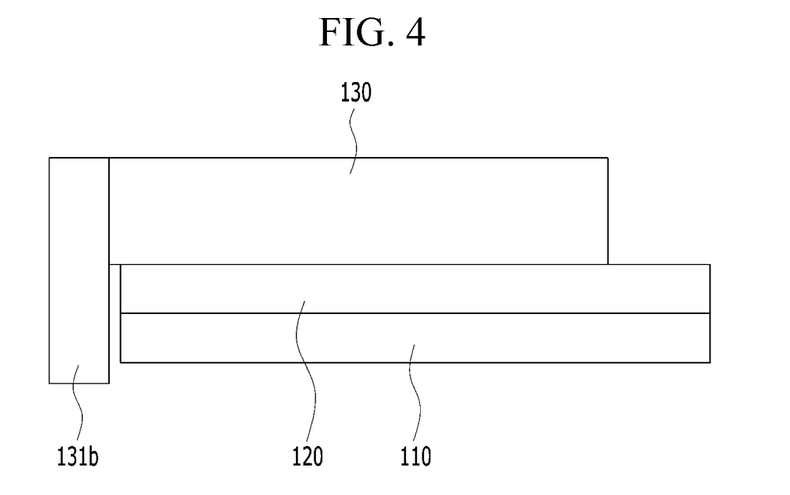
FIG. 4 is a cross-sectional view taken along line A-A' in FIG. 2.
Figure 5:
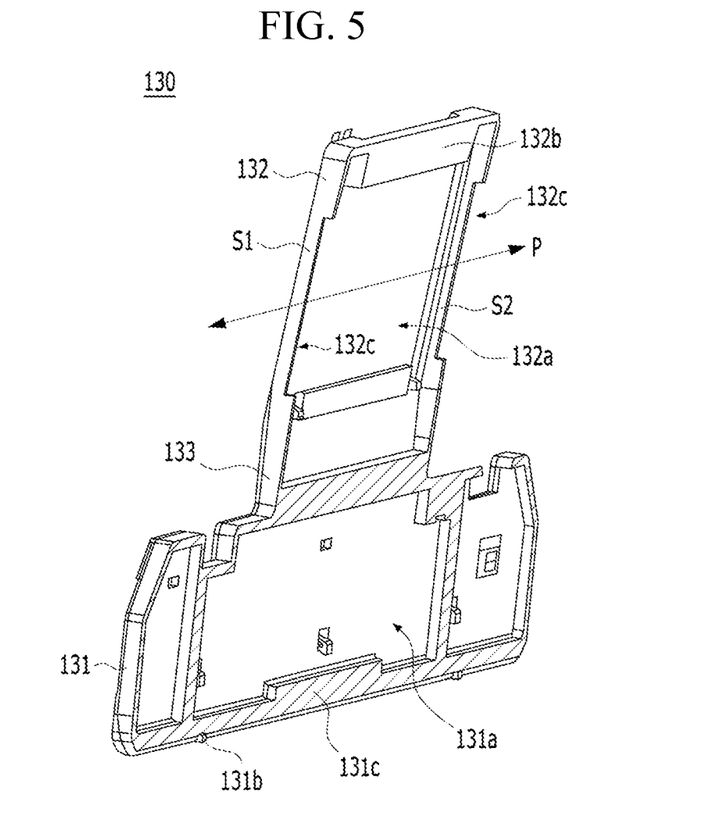
FIG. 5 is a rear perspective view of the guide holder shown in FIG. 3.
Figure 6:
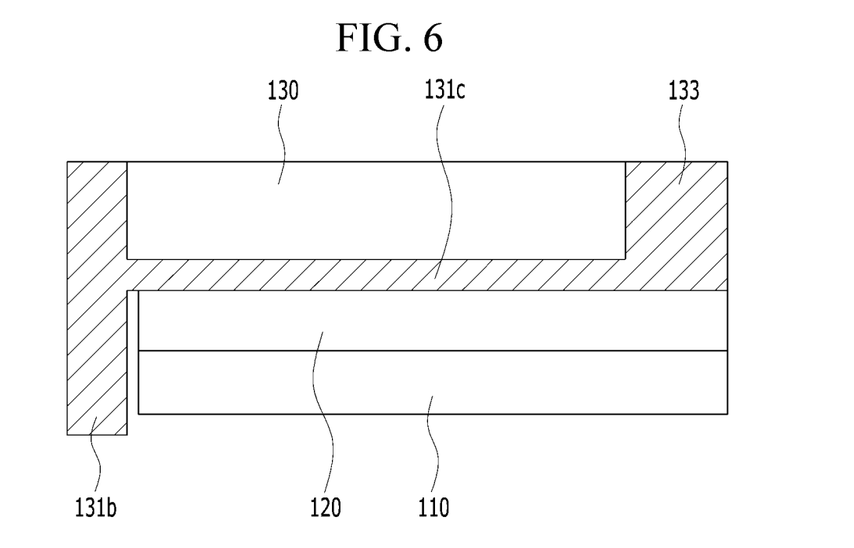
FIG. 6 is a cross-sectional view taken along line B-B' in FIG. 2.
Figure 7:
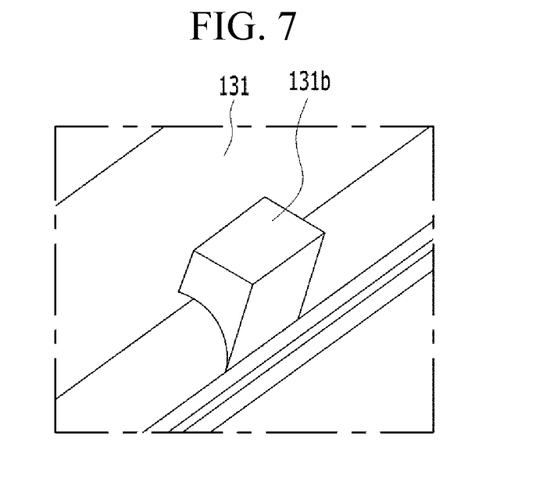
FIG. 7 is an enlarged perspective view of the rib shown in FIG. 3.

FIG. 3 is a plan view showing the guide holder shown in FIG. 2, FIG. 4 is a cross-sectional view taken along line A-A' in FIG. 2, FIG. 5 is a perspective view of the guide holder shown in FIG. 3 when observed from the rear, FIG. 6 is a cross-sectional view taken along line B-B' in FIG. 2, and FIG. 7 is an enlarged perspective view of the rib shown in FIG. 3.

Referring to FIGS. 3 to 7, in the display apparatus 100 according to an embodiment of the present invention, the guide holder 130 may be provided on the second surface of the heat dissipation plate 120.

The guide holder 130 may be a member for coupling a printed circuit board or other set instruments to the rear surface of the display panel 110. The guide holder 130 may be a part of a guide panel. Alternatively, the guide holder 130 may be applied to the structure of the guide panel.

The guide holder 130 may include a first board-coupling portion 131, a second board-coupling portion 132, and a connection portion 133 for connecting the first board-coupling portion 131 and the second board-coupling portion 132 to each other. Here, different respective printed circuit boards may be coupled to the first board-coupling portion 131 and the second board-coupling portion 132. The printed circuit boards 141 and 142 may transmit data signals and driving control signals, which are input from the outside, to the display panel 110. Flexible printed circuit boards (FPCBs) 144 may be provided between the display panel 110 and the printed circuit boards 141 and 142 in order to electrically connect the display panel 110 and the printed circuit boards 141 and 142 to each other. The flexible printed circuit boards may include films or flexible circuits, on which wires are provided, and may be configured to be curved or folded.

The first printed circuit board 141, which is connected to the display panel 110 via a plurality of first flexible printed circuit boards 144, may be coupled to the first board-coupling portion 131. In this case, the first printed circuit board 141 may be a source printed circuit board (S-PCB). The second printed circuit board 142, which is connected to the second flexible printed circuit board 144 connected to a timing controller or a touch panel, may be coupled to the second board-coupling portion 132. In this case, the second printed circuit board 142 may be a control printed circuit board (C-PCB). For example, since the first printed circuit board 141 has a plurality of wires, the first printed circuit board 141 may first be attached to the first board-coupling portion 131, and then the second printed circuit board 142 may be attached to the second board-coupling portion 132 so as to extend from the first printed circuit board 141. In addition, various driving chips including a drive integrated circuit (IC) may be disposed on the first printed circuit board 141.

Although not illustrated in the drawings, a cover shield (not shown) may be provided on the rear surface of the guide holder 130 in order to cover the rear surfaces of the printed circuit boards 141 and 142. In addition, a support structure for coupling the display apparatus 100 to the dashboard 10 of the vehicle and supporting the same may be provided on the rear surface of the guide holder 130.

The first board-coupling portion 131 may include a first board hole 131a formed therein so that the first printed circuit board 141 is coupled thereto, and a rib 131b protruding from one end portion thereof.

The first board hole 131a may be a through-hole penetrating the first board-coupling portion 131, or may be a groove formed in the first board-coupling portion 131. Of course, the first printed circuit board 141 may be coupled to the first board-coupling portion 131 without the first board hole 131a.

The rib 131b may protrude from one end portion of the first board-coupling portion 131 toward the heat dissipation plate 120, and may be in contact with one end portion of the heat dissipation plate 120. That is, when the guide holder 130 is coupled to the second surface of the heat dissipation plate 120, the rib 131b is brought into contact with one end portion of the heat dissipation plate 120, and thereafter the guide holder 130 is rotated so as to be mounted to the second surface of the heat dissipation plate 120, whereby the coupling position of the guide holder 130 may be determined within a predetermined range. The rib 131b may be disposed at a bent portion of each of the plurality of first flexible printed circuit boards 144 connected to the display panel 110. Further, the rib 131b may be disposed in the empty space d between the first flexible printed circuit boards 144, thereby more accurately determining the coupling position of the guide holder 130 and enabling the guide holder 130 to be disposed without application of physical force thereto even in the state in which the first flexible printed circuit boards 144 are bent. The rib 131b may be formed of an elastic material. Here, the elastic material may be a urethane material. When the rib 131b is formed of urethane, it is possible to prevent damage or breakage attributable to contact between the rib 131b and one surface of the display panel 110 during the process of placing the guide holder 130 on the second surface of the heat dissipation plate 120.

The first board-coupling portion 131 may include a contact portion 131c, which is provided on the surface thereof that is in contact with the heat dissipation plate 120. The contact portion 131c may be formed of an elastic material, specifically a urethane material. The contact portion 131c prevents contact between the rigid material of the first board-coupling portion 131 and the rigid material of the heat dissipation plate 120, thereby preventing vibration transfer from the display panel 110 (or the cover window) to the first printed circuit board 141.

The second board-coupling portion 132 may include a second board hole 132a formed therein. Similar to the first board-coupling portion 131, the second board-coupling portion 132 may include a contact portion 132b, which is provided on the surface thereof that is in contact with the heat dissipation plate 120. The second board hole 132a may be a through-hole penetrating the second board-coupling portion 132, or may be a groove formed in the second board-coupling portion 132. Of course, the second printed circuit board 142 may be coupled to the second board-coupling portion 132 without the second board hole 132a. The contact portion 132b provided at the second board-coupling portion 132 may have the same structure and function as the contact portion 131c provided at the first board-coupling portion 131. In this case, the contact portion 132b may be provided in a predetermined pattern in a portion of one surface of the first board-coupling portion 131 or the second board-coupling portion 132, or may be disposed over the entire area thereof. A cooling groove 132c may be formed in one side surface s1 of the second board-coupling portion 132 or in each of two opposite side surfaces s1 and s2 thereof so that a cooling path P is formed between the second board-coupling portion 132 and the heat dissipation plate 120. Although not illustrated in the drawings, this cooling structure (not shown) may also be provided at the first board-coupling portion 131.

The connection portion 133 connects the first board-coupling portion 131 and the second board-coupling portion 132 to each other. The connection portion 133 is formed of an elastic material such as urethane, like the rib 131b or the contact portions 131c and 132b. Therefore, the first board-coupling portion 131 and the second board-coupling portion 132 may be disposed in the state of being curved relative to each other. As a result, even when the display panel 110 has a curved structure or is a flexible display panel, the first board-coupling portion 131 and the second board-coupling portion 132 may be maintained in the state of being coupled to the rear surface of the display panel at various angles.

Except for the portion of the first board-coupling portion 131 to which the first printed circuit board 141 is coupled and the portion of the second board-coupling portion 132 to which the second printed circuit board 142 is coupled, the rib, the connection portion and the contact portions of the guide holder 130 may be formed of an elastic material such as urethane. The remaining portion of the guide holder, other than the portion formed of an elastic material, may be formed of a rigid material such as polycarbonate. In order to be formed of two different materials, the guide holder 130 may be formed through double injection-molding. The guide holder may be easily manufactured through double injection-molding such that the first board-coupling portion 131 and the second board-coupling portion 132 are formed of a polycarbonate material and the rib 131b, the connection portion 133 and the contact portions 131c and 132b are formed of a urethane material.

A comparative example is formed of a single material, namely polycarbonate (PC), and the present disclosure is formed of two different materials through double injection-molding (the structure including the connection portion).

The guide holder (PC) of a comparative example has bending stress of about 82 N and tensile strength of 560 to 670 kgf/mm$^2$, and the guide holder (PC+urethane) of the present disclosure has bending stress of about 65 N and tensile strength of 150 to 200 kgf/mm$^2$. It can be appreciated that the guide holder formed of two different materials has bending stress that is about 80% of that of the guide holder formed of a single material and has tensile strength that decreases to about 70% of that of the guide holder formed of a single material. In response thereto, it can be anticipated that the repulsive force of the guide holder decreases.

As described above, in the display apparatus according to the embodiment of the present invention, since the center region of the guide holder is formed of a flexible material, the printed circuit boards are capable of being coupled to the display panel regardless of the shape of the display panel, i.e., regardless of the planar display panel or the curved display panel. In addition, since the first printed circuit board and the second printed circuit board are capable of being coupled to the rear surface of the curved display panel in the state of being curved relative to each other, it is possible to reduce the incidence of defects in which the guide holder is detached from the rear surface of the curved display panel or the guide holder is damaged by repulsive force. In addition, since the contact area for double injection-molding of two different materials is increased, the durability of the guide holder may be increased. In addition, since the contact portion between the guide holder and the heat dissipation plate is formed of a polyurethane material, transfer of vibrations to the printed circuit boards may be minimized.

A display apparatus according to an embodiment of the present disclosure may include a heat dissipation plate disposed on the rear surface of a display panel, and a guide holder disposed on the second surface of the heat dissipation plate and configured such that a printed circuit board connected to the display panel is coupled to the second surface. The guide holder may be formed through double injection-molding such that at least a portion thereof is formed of different materials.

In the display apparatus according to the embodiment of the present disclosure, the guide holder may include a first board-coupling portion to which a first printed circuit board is coupled, a second board-coupling portion to which a second printed circuit board is coupled, the second board-coupling portion being disposed parallel to and spaced apart from the first board-coupling portion, and a connection portion flexibly connecting the first board-coupling portion and the second board-coupling portion to each other.

In the display apparatus according to the embodiment of the present disclosure, the first board-coupling portion may include a first board hole formed in the first board-coupling portion such that the first printed circuit board is coupled to the first board-coupling portion, and at least one or a plurality of ribs protruding from the second surface of the heat dissipation plate of one end portion of the first board-coupling portion so as to interfere with one end portion of the display panel or the heat dissipation plate.

In the display apparatus according to the embodiment of the present disclosure, the first board-coupling portion or the second board-coupling portion may include a contact portion provided in at least a portion or the entire area of the surface thereof that is in contact with the heat dissipation plate.

In the display apparatus according to the embodiment of the present disclosure, the guide holder may be formed of a urethane material and a polycarbonate material through double injection-molding such that at least one or some of the connection portion, the ribs, and the contact portion are formed of a urethane material.

In the display apparatus according to the embodiment of the present disclosure, the ribs may be disposed between a plurality of flexible printed circuit boards connecting the display panel and the first printed circuit board to each other.

In the display apparatus according to the embodiment of the present disclosure, an adhesive pattern may be provided between the first board-coupling portion and the connection portion or between the second board-coupling portion and the connection portion to increase a contact area between different materials.

In the display apparatus according to the embodiment of the present disclosure, the second board-coupling portion may include a cooling groove formed in at least one side surface or in each of opposite side surfaces thereof to form a cooling path between the second printed circuit board and the heat dissipation plate.

A display apparatus according to another embodiment of the present disclosure may include a display panel including at least one curved region, a heat dissipation plate disposed on the rear surface of the display panel, and a guide holder including a first board-coupling portion to which a first printed circuit board connected to the display panel is coupled, a second board-coupling portion to which a second printed circuit board is coupled, the second board-coupling portion being disposed parallel to the first board-coupling portion, and a connection portion connecting the first board-coupling portion and the second board-coupling portion to each other such that the first board-coupling portion and the second board-coupling portion are flexibly curved corresponding to a curved region of the display panel. The guide holder may further include a rib protruding toward the heat dissipation plate so as to interfere with one end portion of the heat dissipation plate.

In the display apparatus according to the embodiment of the present disclosure, the guide holder may further include contact portions provided at portions of the first board-coupling portion and the second board-coupling portion that are in contact with the heat dissipation plate.

In the display apparatus according to the embodiment of the present disclosure, the guide holder may be formed through double injection-molding such that at least one or some of the connection portion, the rib, and the contact portions are formed of a polyurethane material.

As is apparent from the above description, a display apparatus according to the embodiment of the present disclosure has the following effects.

First, since the center region of the guide holder is formed of a flexible material, printed circuit boards are capable of being coupled to a display panel regardless of the shape of the display panel, i.e., regardless of the planar display panel or the curved display panel.

Second, since the first printed circuit board and the second printed circuit board are capable of being coupled to the rear surface of the curved display panel in the state of being curved relative to each other, it is possible to reduce the incidence of defects in which the guide holder is detached from the rear surface of the curved display panel or the guide holder is damaged by repulsive force.

Third, since the contact area for double injection-molding of two different materials is increased, the durability of the guide holder may be increased.

Fourth, since the contact portion between the guide holder and the heat dissipation plate is formed of a polyurethane material, transfer of vibrations to the printed circuit boards may be minimized.

However, the effects achievable through the disclosure are not limited to the above-mentioned effects, and other effects not mentioned herein will be clearly understood by those skilled in the art from the above description.

The features, structures, effects, and the like described in association with the embodiments above are incorporated into at least one embodiment of the present disclosure, but should not be construed to limit the disclosure only to the one embodiment. Furthermore, the features, structures, effects, and the like exemplified in association with respective embodiments can be implemented in other embodiments through combination or modification by those skilled in the art. Therefore, content related to such combinations and modifications should be construed as falling within the scope of the present disclosure.

While the present disclosure has been particularly described with reference to embodiments, the present disclosure is not limited thereto. It will be understood by those skilled in the art that various replacements, modifications and applications, which are not illustrated above, may be made without departing from the spirit and scope of the present disclosure. For example, each component illustrated in the embodiments may be modified and made. It should be interpreted that differences related to these modifications and applications are included in the scope of the disclosure, which is defined by the appended claims and equivalents thereto.

The invention claimed is:

1. A display apparatus, comprising:
a display panel having a front surface and a rear surface opposite to the front surface, the display panel having at least one curved region and being a multi-layer stack configured to display an image at the front surface;
a heat dissipation plate having a front surface disposed on the rear surface of the display panel and a rear surface opposite to the front surface; and
a guide holder disposed on the rear surface of the heat dissipation plate, the guide holder being configured to couple a printed circuit board connected to the display panel to the rear surface of the heat dissipation plate,
wherein the guide holder includes distinct sections of a rigid material and an elastic material to support the at least one curved region of the display panel, and
wherein the heat dissipation plate is positioned between the display panel and the guide holder.

2. The display apparatus according to claim 1, wherein the guide holder further includes:
a first board-coupling portion to which a first printed circuit board is coupled;
a second board-coupling portion to which a second printed circuit board is coupled, the second board-coupling portion being disposed parallel to and spaced apart from the first board-coupling portion; and
a connection portion flexibly connecting the first board-coupling portion and the second board-coupling portion to each other.

3. The display apparatus according to claim 2, wherein the first board-coupling portion further includes:
a first board hole in the first board-coupling portion through which the first printed circuit board is coupled to the first board-coupling portion; and
at least one rib protruding from the second surface of the heat dissipation plate at one end portion of the first board-coupling portion, the at least one rib in contact with a portion of the display panel or a portion of the heat dissipation plate.

4. The display apparatus according to claim 3, wherein the second board-coupling portion includes a second board hole in the second board-coupling portion through which the second printed circuit board is coupled.

5. The display apparatus according to claim 3, wherein the first board-coupling portion or the second board-coupling portion includes a contact portion provided in at least a portion or an entire area of a surface of the first board-coupling portion or the second board-coupling portion that is in contact with the heat dissipation plate.

6. The display apparatus according to claim 5, wherein the elastic material is a urethane material and the rigid material is a polycarbonate material, and wherein at least one of the connection portion, the at least one rib, and the contact portion include the urethane material.

7. The display apparatus according to claim 3, wherein the at least one rib is disposed between a plurality of flexible printed circuit boards connecting the display panel and the first printed circuit board to each other.

8. The display apparatus according to claim 2, wherein an adhesive pattern is provided between the first board-coupling portion and the connection portion or between the second board-coupling portion and the connection portion to increase a contact area between the different materials.

9. The display apparatus according to claim 2, wherein the second board-coupling portion includes a cooling groove in at least one side surface or in each of opposite side surfaces of the second board-coupling portion, the cooling groove configured to provide a cooling path between the second printed circuit board and the heat dissipation plate.

10. A device, comprising:
a display apparatus, including:
a display panel with a front surface configured to display an image, and a rear surface opposite to the front surface, the display panel including at least one curved region;
a heat dissipation plate disposed on the rear surface of the display panel; and
a guide holder including a first board-coupling portion to which a first printed circuit board connected to the display panel is coupled, a second board-coupling portion to which a second printed circuit board is coupled, the second board-coupling portion being disposed parallel to the first board-coupling portion, and a connection portion connecting the first board-coupling portion and the second board-coupling portion to each other such that the first board-coupling portion and the second board-coupling portion are flexibly curved corresponding to the at least one curved region of the display panel,
wherein the guide holder further includes a rib protruding toward the heat dissipation plate so as to contact one end portion of the heat dissipation plate,
wherein the heat dissipation plate is positioned between the display panel and the guide holder.

11. The device according to claim 10, wherein the guide holder further includes contact portions provided at portions of the first board-coupling portion and the second board-coupling portion that are in contact with the heat dissipation plate.

12. The device according to claim 11, wherein the guide holder is formed through double injection-molding having at least one of the connection portion, the rib, and the contact portions formed of a polyurethane material.

13. The device of claim 10, wherein the guide holder is an external support structure for at least the display panel, wherein the first board-coupling portion includes a first groove that receives the first printed circuit board and the second board-coupling portion includes the second printed circuit board.

14. The device of claim 10, wherein at least a portion of the display panel is in direct contact with the heat dissipation plate and at least a portion of the guide holder is in direct contact with the heat dissipation plate.

15. The device of claim 10, wherein the guide holder includes distinct sections of a rigid material and an elastic material to support the at least one curved region of the display panel.

16. A display apparatus, comprising: a display panel having a front surface and a rear surface opposite to the front surface; a heat dissipation plate having a front surface disposed on the rear surface of the display panel and a rear surface opposite to the front surface of the heat dissipation plate; and a guide holder disposed on the rear surface of the heat dissipation plate, the guide holder being configured to couple a printed circuit board connected to the display panel to the rear surface of the heat dissipation plate, wherein the guide holder includes distinct sections of a rigid material and an elastic material to support at least one curved region of the display panel, wherein the heat dissipation plate is positioned between the display panel and the guide holder.

17. The display apparatus of claim 16, wherein the guide holder further includes:
- a first board-coupling portion to which a first printed circuit board is coupled;
- a second board-coupling portion to which a second printed circuit board is coupled, the second board-coupling portion being disposed parallel to and spaced apart from the first board-coupling portion; and
- a connection portion flexibly connecting the first board-coupling portion and the second board-coupling portion to each other.

18. The display apparatus according to claim 17, wherein the first board-coupling portion further includes:
- a first board hole in the first board-coupling portion through which the first printed circuit board is coupled to the first board-coupling portion; and
- at least one rib protruding from the second surface of the heat dissipation plate at one end portion of the first board-coupling portion, the at least one rib in contact with a portion of the display panel or a portion of the heat dissipation plate.

19. The display apparatus according to claim 18, wherein the second board-coupling portion includes a second board hole in the second board-coupling portion through which the second printed circuit board is coupled.

* * * * *